United States Patent
El-Husseini et al.

(10) Patent No.: US 9,455,586 B2
(45) Date of Patent: Sep. 27, 2016

(54) METHOD FOR CONTROLLING AN EUV SOURCE

(71) Applicant: USHIO Denki Kabushiki Kaisha, Tokyo-to (JP)

(72) Inventors: Mohamad Hussein El-Husseini, Milmort (BE); Sven Walter Probst, Aachen (DE)

(73) Assignee: USHIO Denki Kabushiki Kaisha, Tokyo-to (JP)

( * ) Notice: Subject to any disclaimer, the term of this patent is extended or adjusted under 35 U.S.C. 154(b) by 434 days.

(21) Appl. No.: 14/135,177

(22) Filed: Dec. 19, 2013

(65) Prior Publication Data

US 2014/0176083 A1   Jun. 26, 2014

(30) Foreign Application Priority Data

Dec. 21, 2012   (DE) .................... 10 2012 113 005

(51) Int. Cl.

| | | |
|---|---|---|
| *H02J 7/00* | (2006.01) | |
| *H05G 2/00* | (2006.01) | |
| *H05B 41/30* | (2006.01) | |
| *G03F 7/20* | (2006.01) | |

(52) U.S. Cl.
CPC ............. *H02J 7/0052* (2013.01); *H02J 7/007* (2013.01); *H02J 7/0072* (2013.01); *H05B 41/30* (2013.01); *H05G 2/001* (2013.01); *G03F 7/70033* (2013.01)

(58) Field of Classification Search
CPC ...... H02J 7/0052; H02J 7/007; H02J 7/0072; G03F 7/70033; H05B 41/30; H05G 2/001

USPC .......................................... 320/139, 155–159
See application file for complete search history.

(56) References Cited

U.S. PATENT DOCUMENTS

| | | | |
|---|---|---|---|
| 3,579,111 A | 5/1971 | Johannessen et al. | |
| 2002/0163313 A1 | 11/2002 | Ness et al. | |
| 2010/0225267 A1* | 9/2010 | Elhalis ................ | H01M 10/441 320/101 |
| 2013/0241467 A1* | 9/2013 | Sahinoglu ............. | H02J 7/0073 320/107 |
| 2015/0022795 A1* | 1/2015 | Coenen ............... | G03F 7/70033 355/67 |

FOREIGN PATENT DOCUMENTS

| | | |
|---|---|---|
| DE | 4202836 A1 | 8/1993 |
| DE | 102005045569 A1 | 12/2006 |

* cited by examiner

*Primary Examiner* — Nathaniel Pelton
(74) *Attorney, Agent, or Firm* — Patentbar International, P.C.

(57) ABSTRACT

A method for triggering a resonant charging circuit for a device for generating short-wavelength radiation based on discharge plasma is described. Switching times of the resonant charging circuit are determined in a non-time-critical method segment by simulation and are stored to be repeatedly retrievable. Measurement values of the resonant charging circuit are determined in real time in a time-critical method segment. At least one second switching time (t2) at which a discharging switch of the resonant charging circuit is triggered in order to supply at a firing time (t3) a discharge voltage ($U_{wanted}$), and the firing time (t3) are calculated. The device has a first input unit, a first simulation unit, a first regression unit, a first measurement value unit, a first evaluation unit and a control unit for triggering a discharging switch of the resonant charging circuit.

17 Claims, 9 Drawing Sheets

METHOD FOR CONTROLLING AN EUV SOURCE

RELATED APPLICATIONS

This application claims priority to German Patent Application No. DE 10 2012 113 005.1, filed Dec. 21, 2012, which is incorporated herein by reference in its entirety.

FIELD OF THE INVENTION

The invention is directed to a method and a device for triggering a resonant charging circuit for a device for generating short-wavelength radiation based on a discharge plasma which is generated in a pulsed manner.

BACKGROUND OF THE INVENTION

A device of this type and use thereof are known in principle from DE 10 2005 045 569 A1.

Devices for generating short-wavelength radiation based on a discharge plasma which is generated in a pulsed manner are used, for example, to implement lithography methods, particularly when it is a question of high repetition frequency of the discharge processes. At the same time, fluctuations in the amount of radiation emitted are to be limited to less than 1% to ensure a consistent quality of the emitted radiation.

The electric voltage, typically several kilovolts, required for generation of a discharge plasma is supplied via a (resonant) charging circuit with a pulsed capacitor or capacitor bank. In so doing, a charging switch of the charging circuit is closed at a first switching time and the pulsed capacitor is charged. A virtually sinusoidal current flow through the inductor develops during this phase. At a second switching time, the charging switch is opened and a freewheeling switch is closed so that the energy stored in the inductor is decreased through a further rise in voltage at the pulsed capacitor. At a third point in time which is defined by the current zero crossing of the inductor, the plasma is ignited, i.e., a flow of current is initiated between two electrodes between which the plasma is to be generated.

In this way, the energy stored by the charging circuit for generation of the discharge plasma is provided as a discharge voltage at two electrodes which are separated by a gap.

When an electrically conductive channel is generated or provided between the electrodes at a firing time, the available energy flows along the channel, thereby exciting emission of a plasma of an emitter material. At the firing time, the discharge voltage will have reached a maximum. An electrically conductive channel can be produced through the evaporation of an emitter material, e.g., tin, by means of a high-energy radiation, e.g., a laser. In so doing, the emitter material can be present, for example, on the electrodes or can be introduced, for example, by injection of droplets, therebetween.

In devices for generating discharge plasmas, it is difficult in actual practice to coordinate the first and second switching times and the firing time in such a way that high repetition frequencies are accompanied by minimal deviations in the amount of radiation emitted by the discharge plasma. The reason for this consists in fluctuating parameter values, for example, voltage differences, different component values and variable plasma efficiency, i.e., the extent of conversion of electrical energy into radiation energy. In this respect, parameter values which change only slightly over a number of pulses may differ from those which do not change only slightly from pulse to pulse. As a rule, the parameter values which change slightly show a certain tendency in the direction of their changes (long-term drift), while the parameter values which change from pulse to pulse usually vary stochastically.

The device suggested in DE 10 2005 045 569 A1 has a resonant charging circuit with at least one charging switch for charging a charging capacitor of the resonant charging circuit and at least one discharging switch for discharging the resonant charging circuit. Further, a control is provided which calculates the switching times of the charging switch in real time depending on input values and one or more reference quantities. In order to reduce the required computing effort for coordinating the switching times, DE 10 2005 045 569 A1 suggests relying for calculation upon an approximation algorithm or on lookup tables which were calculated and set up in a non-time-critical method segment. In a time-critical method segment, actual measurement values, e.g., of the charging voltage, can be taken into consideration in real time and the switching times can be determined. The charging switch is triggered based on the calculated first and second switching times.

By means of the device according to DE 10 2005 045 569 A1, the second switching times are calculated in such a way that the desired discharge voltage is supplied at a precisely fixed firing time.

For calculating the second switching times and the firing time, it is known to apply semianalytic methods to a simplified model of a resonant charging circuit. First, a relationship is determined between a desired charging voltage and the second switching time. This relationship is typically nonlinear and can be described by a polynomial. The firing time can be determined using another, analytic relationship. This analytic relationship in which the second switching time is entered further contains simplifying assumptions about the behavior of the resonant charging circuit.

A disadvantage in a procedure of this kind consists in that the effects of various elements of the resonant charging circuit are not sufficiently acquired, if at all, due to the simplifications. Thus the effect of an existing degaussing circuit is not taken into account. Further, the DC voltage source is assumed to be ideal.

Due to these simplifications, significant errors can occur in calculating the second switching time and firing time which must be corrected subsequently by introducing optimization factors.

In the procedure mentioned above, it is also very difficult or even impossible to determine the relationship between the desired discharge voltage and the second switching time after changes in the topology of the resonant charging circuit. Every change in topology requires a new determination of the relationship, and complex topologies cannot be described at all by this procedure.

SUMMARY OF THE INVENTION

It is the object of the invention to suggest a novel possibility for triggering a resonant charging circuit which overcomes the disadvantages of the prior art. The invention has the further object of providing a novel device for triggering a resonant charging circuit.

In a method for triggering a resonant charging circuit for a device for generating short-wavelength radiation based on a discharge plasma generated in a pulsed manner in which switching times of the resonant charging circuit are determined in a non-time-critical method segment by means of a simulation and are stored so as to be repeatedly retrievable and measurement values of the resonant charging circuit are determined in real time in a time-critical method segment, the above-stated object is met according to the invention in that at least one second switching time, at which a discharging switch of the resonant charging circuit is triggered in order to supply at a firing time a discharge voltage for generating the discharge plasma, and the firing time at which a discharge plasma is generated are calculated.

The firing time can be seen as a switching time of the resonant charging circuit because at this firing time the resonant charging circuit is discharged and is fundamentally affected thereby. In further embodiments of the method according to the invention, the firing time can coincide with at least one second switching time.

A non-time-critical method segment preferably includes sub-steps of the method according to the invention which are not influenced by current, actual operating parameters of the resonant charging circuit. The behavior of the resonant charging circuit is simulated for a quantity of combinations of parameter values which do not change only slightly from pulse to pulse.

Thus, for example, user-defined parameter values and at least one second switching time which is predefined by a user can be used in the sub-steps of the non-time-critical method segment for determining the second switching time and the firing time as input values. The input values are preferably formed by user-defined parameter values and by at least one second switching time which is predefined by a user. The sub-steps of the non-time-critical method segment can be carried out in isolation from an actual operation of the device for generating short-wavelength radiation. The computing requirement during operation of the device can be advantageously minimized in this way.

The user-defined parameter values can also take into account specific parameter values which depend on the specific topology and the characteristics of the elements of the resonant charging circuit, i.e., resistances, inductances or capacitances of the respective resonant charging circuit.

A time-critical method segment comprises sub-steps which are influenced by actual operating parameters. Influence can be exerted, for example, by the input of measurement values at one or more sub-steps of the time-critical method segment.

User-defined parameter values can be, or can include, first input parameters which change slightly over a quantity of pulses. These first input parameters may be subject to drift which can be caused, for example, by heating of components of the resonant charging circuit during operation thereof or by changing environmental conditions such as changed ambient temperatures or atmospheric humidity. A slight change can be, for example, a deviation of less than 5% from the parameter value of the preceding pulse.

First input parameters may be, for example, compiled parameters such as electrical resistance, capacitance and inductance. These parameters are preferably expressed individually as scalars and collectively as vectors.

User-defined parameter values can also be second input parameters which are variable (fluctuate) from pulse to pulse. As a rule, no drift occurs; rather the fluctuations in direction and amount are random or are at least not unambiguously directed, i.e., they do not exhibit drift. The fluctuation can be more than 5% of the amount of the preceding parameter value. Examples of second user-defined parameter values are the DC link circuit and the starting parameters, e.g., the applied (residual) voltages of a charging capacitor or a charging capacitor bank. The second input parameters are preferably supplied as vectors or as a shared input vector for the subsequent simulation. In order to allow a suitably large set of simulation data to be generated, a range of second input parameters is defined by the user. In so doing, a compromise must be found between approximation accuracy and computing requirement. The defined ranges of the second input parameters are preferably selected such that the second switching times and firing times calculated in the time-critical method segment lie within a desired range.

A second switching time can coincide with a firing time. Generally, however, these two times occur apart from one another because a further increase in discharge voltage takes place after the second switching time during the freewheeling phase.

Further, it is preferable that in addition to the variable switching times predefined switching times are also used for triggering the charging circuit. Accordingly, a second switching time or a range of a second switching time, which is preferably likewise provided for the simulation as vector, can be used.

A preferred embodiment of the method according to the invention includes five essential steps (steps A1 to E1) of the non-time-critical method segment and a further five steps (steps F1 to J1) of the time-critical method segment, four of which steps (F1, H1, I1 and J1) are essential to the invention. First, input values are provided in a step A1. Next, in a step B1 in the simulation for every combination of input values, a respective theoretical variable firing time and a desired voltage of a charging capacitor are calculated. An input matrix is then formed in a step C1 taking into account all combinations of input values and the respective simulated values. This input matrix is converted in a step D1 such that switching times selected from the input matrix for triggering a charging switch serving to charge the charging capacitor and for triggering the discharging switch are formed in a result matrix as results of the converted input matrix. In a fifth step, a step E1, a mathematical relationship is determined between the converted input matrix and the result matrix. This mathematical relationship is represented in the form of a coefficient matrix and is retrievably stored. The non-time-critical method segment concludes with the generation and storage of the coefficient matrix.

In step C1, the combinations of input values can be taken into account initially, for example, by means of statistical methods such as multiple regressions or iterative regression analyses, but are selected as an outcome of sub-steps of the statistical methods.

In the time-critical method segment, a first measurement value matrix is formed in a step F1 from the measurement values acquired in the time-critical method segment. In an optional step G1, at least one user-defined parameter value of a voltage of the charging capacitor can also be provided and added to the first measurement value matrix. The voltage of the charging capacitor can be a user-defined desired discharge voltage of the charging capacitor. This will be referred to hereinafter for the sake of simplicity as a desired discharge voltage. The first measurement value matrix is then multiplied by the coefficient matrix in a step H1. Based on the results of the multiplication, at least the second switching time and the firing time are calculated in a step I1. In a final step J1, the resonant charging circuit is triggered so that the discharging switch is actuated at the variably adjustable second switching time in order to provide the discharge voltage at a firing time.

With the method according to the invention it is advantageously possible to simulate any topology of the resonant charging circuit regardless of its complexity. Likewise, through the use of the second switching times and firing times determined in the non-time-critical method segment and because they can be retrieved in a simple manner when implementing the time-critical method segment, the advantage of a fast and efficient calculation is obtained. Further, the method according to the invention is itself more precise when applied to simple topologies than prior-art methods because disadvantageous simplifying assumptions about the behavior of the topology are not made. Compared with known methods in which lookup tables are used, the method according to the invention has the advantage that any value is possible for the switching times and firing times. In contrast, lookup tables are limited compilations of possible combinations from which the most obvious, but not necessarily the optimal, combinations can be selected. Figuratively, it could be said that the combinations of switching times and firing times to be used are provided in an analog manner by the method according to the invention, whereas this is carried out in a discrete, digital manner when lookup tables are used.

In a further development of the invention, the method according to the invention can be used in an expanded resonant charging circuit. The expanded resonant charging circuit preferably has at least two resonant chargers, each of which can have its own voltage sources with a respective supply voltage. Each resonant charger has a charging switch and a discharging switch which are opened or closed at a second switching time (referred to hereinafter, when indicated, as switchover time to draw a clearer distinction) associated with the respective resonant charger. The expanded resonant charging circuit can be discharged by a discharging switch which is shared by the resonant chargers. In this regard, the shared discharging switch can be one of the discharging switches of the discharging circuits or an additional discharging switch.

Since each of the resonant chargers has a charging switch and discharging switch, a second switching time (switchover time) can be determined for one of the resonant chargers, and by means of this switchover time of the one resonant charger a switchover time of the other resonant charger can be determined, and through the switchover time of the other resonant charger a second switching time is obtained at which a discharging switch of the resonant charging circuit is triggered so as to provide a discharge voltage for generating the discharge plasma at a firing time. Accordingly, the switchover times of the resonant chargers are collectively responsible for providing the discharge voltage at the firing time.

The supply voltages can differ from one another. In case of different supply voltages, the desired discharge voltages of the resonant chargers are achieved at different times. In this regard, the charging duration of the resonant charger with the higher supply voltage should be shorter than the charging duration of the resonant charger with the lower supply voltage.

So that only one second switching time need be calculated nevertheless, the method according to the invention is preferably carried out by means of an expanded charging circuit in the following manner:

In a step A1 of the non-time-critical method segment, additional steps are carried out for adapting the specific parameter values to the expanded resonant charging circuit. The first additional step a1) consists in comparing the amounts of the supply voltages. In a second additional step a2), a user-defined second switching time (switchover time) is assigned to the charging switch of the resonant charger having the higher supply voltage. At the second switching time, the charging switch of this resonant charger is opened and the discharging switch of this resonant charger is closed. Next, in a step a3) a topology with symmetrically compiled first input parameters is generated, and the first input parameters of the resonant charger having the higher supply voltage are used. The first input parameters of the topology are included in the simulation of the non-time-critical method segment. In a step a4), a further second switching time is calculated based on the topology, at which further second switching time the charging switch of the resonant charger having the lower supply voltage is opened and the discharging switch of this resonant charger is closed. The further second switching time is provided for the simulation.

In step B1 of the non-time-critical method segment, the theoretical variable firing time and a desired discharge voltage of the charging capacitor are calculated.

The amounts of the supply voltages of the resonant chargers are compared between steps B1 and C1 of the non-time-critical method segment. The second switching time is assigned to the resonant charger having the smaller amount of supply voltage. The second switching time (switchover time) is assigned to the resonant charger having the higher amount of supply voltage. In step D1, the result matrix is converted after simulated switching times and a simulated firing time.

In step D1 of the non-time-critical method segment, the result matrix is converted corresponding to the topology after the first switchover time, the second switchover time and the firing time.

In the two above-mentioned embodiments of the method according to the invention, a voltage of the charging capacitor is provided in step G1 as a user-defined parameter value, preferably as a desired discharge voltage, and is added to the measurement value matrix. In further embodiments of the method according to the invention, the parameter value of the voltage of the charging capacitor that is added to the measurement value matrix is selected based on a comparison of an actually achievable maximum voltage of a charging capacitor and a desired discharge voltage of the charging capacitor. All of the embodiments have in common that an actual behavior of a resonant charging circuit or an expanded resonant charging circuit is simulated based on input values, and switching times and a firing time are calculated taking into account measurement values collected in a time-critical method segment in order to provide these switching times and firing time subsequently for triggering the resonant charging circuit or expanded resonant charging circuit.

In a further embodiment of the method according to the invention it is possible to compare the desired discharge voltage with an achievable maximum discharge voltage and to add the smaller discharge voltage to the first measurement value matrix.

It is possible for a further process with the five steps A2 to E2 of the non-time-critical method segment in which input values are supplied in step A2 to be carried out in the non-time-critical method segment; in step B2, a theoretically achievable maximum discharge voltage and a second switching time at which the charging capacitor has reached the maximum achievable discharge voltage are calculated; in step C2, a second input matrix is formed; in step D2 the second input matrix is converted such that the second switching time and the maximum achievable discharge voltage are in a further result matrix. A second coefficient matrix for describing the mathematical relationship between the converted second input matrix and the second result matrix is retrievably stored in a step E2.

A mathematical relationship can be expressed, for example, by a functional equation or an equation system. Naturally, in so doing the mathematical relationship can be represented in the usual notation for matrix and vector computation.

In a further development of the method according to the invention, further steps F2 and G2 can also be carried out, wherein a second measurement value matrix or a further measurement value matrix is formed in step F2. An additional step f1 in which the second coefficient matrix is multiplied by the second measurement value matrix and at least one value of a maximum discharge voltage that can actually be achieved is calculated is carried out between steps F2 and G2. In a further additional step f2 between steps F2 and G2, the value of the maximum achievable discharge voltage is compared with the value of the desired discharge voltage. One of the values is selected and is supplied for the calculation of at least the second switching time. The parameter value of the maximum discharge voltage that can actually be achieved is preferably selected when it is smaller in amount than the desired discharge voltage. Otherwise, the parameter value of the desired discharge voltage is selected.

In a further development of the method according to the invention it is also possible for a further process with steps C2 to E2 to be carried out in the non-time-critical method segment, in which further process a theoretically achievable maximum discharge voltage and a second switching time are determined by means of mathematical models in a step c2-1 preceding step C2; in step C2, a second input matrix is formed; the second input matrix is converted in step D2 in such a way that the theoretically achievable maximum discharge voltage and the second switching time, as results of the converted second input matrix, are in a second result matrix, and a mathematical relationship is determined in step E2 between the converted second input matrix and the second result matrix and is retrievably stored in the form of a second coefficient matrix.

The switching times and firing times determined thus far in the method according to the invention during the non-time-critical method segment are theoretical values. In order to obtain actual values of the switching times and firing times, the measurement values to be collected in the time-critical step must still be taken into account and correlated with the theoretical values of the switching times and firing times.

Mathematical models are, for example, regression models such as are well known in principle from the field of inferential statistics. The regression rules, e.g., the methods of least squares regression, can be selected according to the requirements of the procedure in question. Mathematical models can also be simulations, e.g., permutation-based simulations.

The embodiment mentioned above can be expanded in such a way that a further process with steps F2 and G2 is carried out in the time-critical method segment, wherein the measurement value matrix from step F1 of the process is used in step F2 of the further process; an additional step f1 in which the second coefficient matrix is multiplied by the first measurement value matrix and at least one value of a maximum achievable discharge voltage is calculated is carried out between F2 and G2; a further additional step f2 in which the value of the maximum achievable discharge voltage is compared with the value of the desired discharge voltage and one of the values is selected and added to the first measurement value matrix for use in the first evaluation unit is carried out between steps F2 and G2. The smaller-amount value of the compared discharge voltages is preferably selected.

The second coefficient matrix is multiplied by the measurement value matrix; at least one actually achievable maximum discharge voltage is calculated; the parameter value of the actually achievable maximum discharge voltage of the charging capacitor is compared with the parameter value of the desired voltage of the charging capacitor and one of the two parameter values is selected and is provided for the calculation of at least the second switching time.

In a further embodiment of the method according to the invention, the firing time at which the discharge voltage reaches a desired value is determined and the data about the second switching time and the firing time are made available for controlling a radiation source. Through control of the radiation source, the radiation source can be triggered in such a way that an electrically conductive channel for the discharge of the discharge voltage is created by means of a directed beam and by impingement and evaporation of a target material at the firing time.

The object of the invention is further met by a device for triggering a resonant charging circuit for a device for generating short-wavelength radiation based on a discharge plasma which is generated in a pulsed manner, wherein the resonant charging circuit has at least one charging switch for charging a capacitor of the resonant charging circuit and at least one discharging switch for discharging the resonant charging circuit. The device further includes an input unit for entering input values comprising user-defined parameter values and switching times which are predefined by a user. A simulation unit is also provided for simulating the resonant charging circuit based on the input values and for calculating switching times and discharge voltages; a regression unit is provided for determining and providing calculation data based on results of the simulation; a measurement value unit is provided for providing measurement values of the resonant charging circuit which are measured in real time; an evaluation unit is provided for calculating at least one second switching time and a firing time based on the results of the regression unit and provided measurement values, and a control unit is provided for triggering the discharging switch of the resonant charging circuit at the second switching time.

In a further embodiment the device can also include a second input unit; a second simulation unit; a second regression unit and a second measurement value unit. Further, a second evaluation unit can be provided for determining a maximum achievable discharge voltage based on the results of the regression unit and on provided measurement values of the measurement value unit; a control unit is provided for triggering the discharging switch of the resonant charging circuit at the second switching time, and a third comparison unit is provided for comparing the actually achievable maximum discharge voltage with a desired discharge voltage.

In a further embodiment for triggering an expanded resonant charging circuit the device can be provided with at least two resonant chargers, each of which has its own voltage source having a supply voltage in each instance and a charging switch in each instance. Further, in the further embodiments a first comparison unit for comparing the supply voltages; a second comparison unit for comparing the supply voltages, and a logic unit for calculating (i.e., simulating) the second switching time based on a symmetrical topology of the expanded resonant charging circuit generated by the logic unit can be provided.

It is also possible that a device according to the invention for triggering a resonant charging circuit has a mathematical modeling unit for determining a maximum achievable discharge voltage and a second switching time based on at least one result of the simulation unit. The device according to the invention further comprises a second regression unit, a second measurement value unit and a second evaluation unit for calculating an actually achievable maximum discharge voltage based on the results of the second regression unit and provided measurement values of the second measurement value unit. The third comparison unit serves to compare the actually achievable maximum discharge voltage with a desired discharge voltage of the charging capacitor. The theoretically achievable maximum discharge voltage and the second switching time can also be determined additionally based on at least one input value.

The embodiments of the device according to the invention have in common that a discharging switch can be triggered by the control unit at the firing time.

In a further embodiment of the device according to the invention, a signal line to controlling means of a radiation source can be provided, by means of which at least the second switching time and the firing time can be conveyed to the controlling means of the radiation source. This makes it possible to coordinate a radiation emission of the radiation source and an evaporation of the target material by the emitted radiation with the second switching time, the attainment of the desired discharge voltage and the firing time.

BRIEF DESCRIPTION OF THE DRAWINGS

The invention will be described more fully in the following with reference to embodiment examples and drawings. The drawings show.

DETAILED DESCRIPTION OF THE PREFERRED EMBODIMENTS

Figure 1:
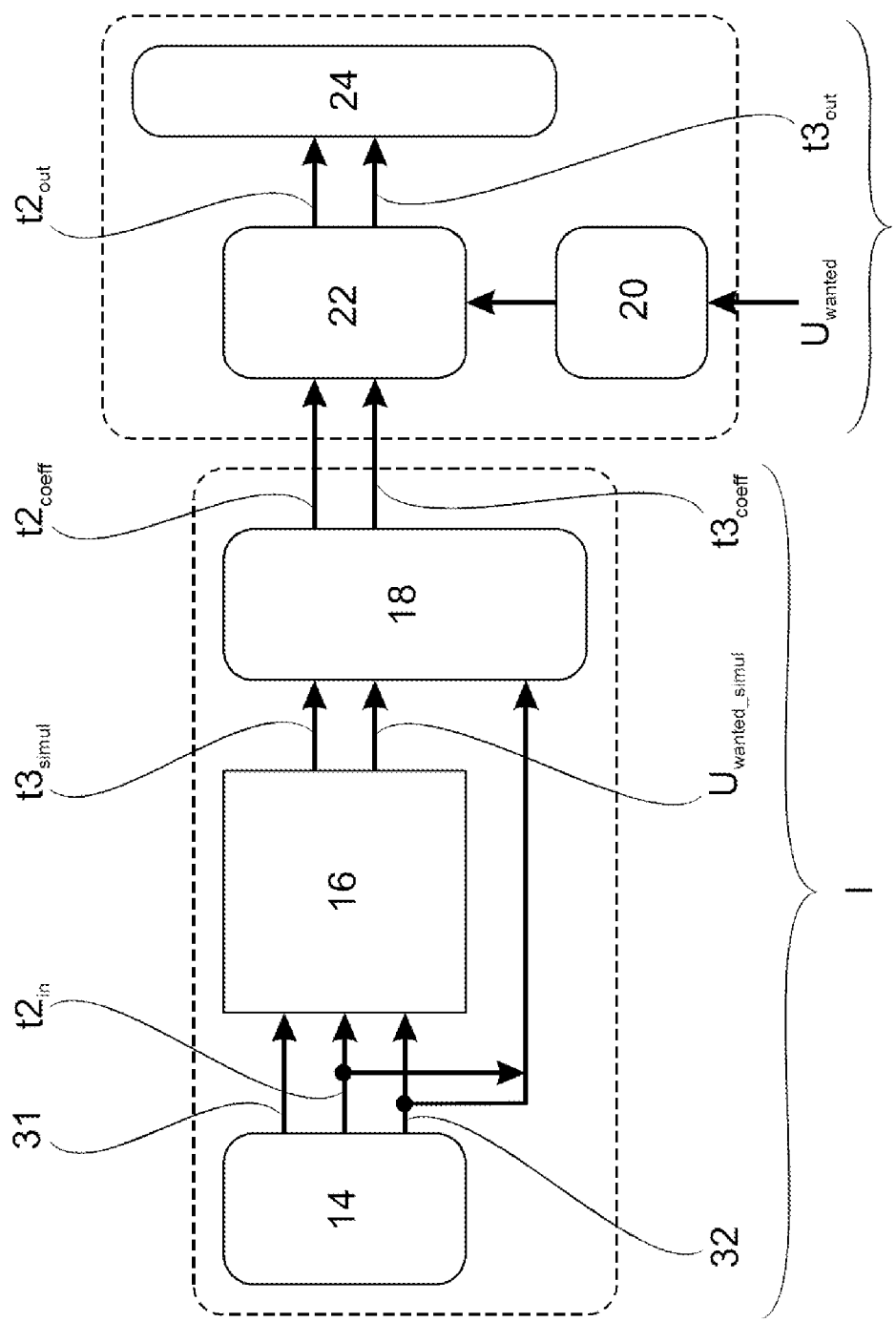
FIG. 1 is a block diagram of a first embodiment of a device according to the invention for triggering a resonant charging circuit.

A first embodiment of a device according to the invention for triggering a resonant charging circuit 1 (see FIG. 2) is shown schematically in FIG. 1. The essential elements included in the device are a first input unit 14, a first simulation unit 16, a first regression unit 18, a first measurement value unit 20, a first evaluation unit 22 and a control unit 24.

The first input unit 14 comprises a storage, a keypad and a screen and allows information to be entered by the user. The information includes input values of which specific parameter values of the resonant charging circuit 1 are a component. The input values are first input parameters 31, second input parameters 32 and a second switching time $t2_{in}$. The input values are classed by the first input unit 14 and rendered in data formats that can be processed computationally for subsequent elements of the device according to the invention. In further embodiments of the first input unit 14, input can also be carried out via a touch-sensitive screen, speech control, data storage device and/or network connection.

In the following, indices are added to the switching times, switchover times and discharge voltages to be described so as to make the embodiment examples of the method more understandable. The indices indicate the step in which the data, e.g., of the respective switching times, switchover times or applied discharge voltage, are found in the method segments I and II to be described more fully in the following or the way these data were generated. For example, a second switching time t2 entered in the first input unit 14 in the form of corresponding data is identified by the index "in". As the method proceeds, the data of the second switching time t2 are changed and are given indices characterizing a state of the data. Thus the simulated data are indicated by the index "simul", the data in the form of coefficients are indicated by the index "coeff", and the output data of the second switching time t2 are indicated by the index "out".

The first simulation unit 16 allows a simulation of all combinations of the input values. Every time a simulation is carried out, a log can be prepared and stored which shows the input values that are used, the user-defined parameter values, the simulation parameters that are used, e.g., quantity of simulation processes, the rules for the selection of results and the selection and error criteria applied. The first simulation unit 16 is designed to simulate a respective simulated firing time $t3_{simul}$ and a desired discharge voltage $U_{wanted\circ simul}$ of a charging capacitor at firing time $t3_{simul}$ for every combination of input values and specific parameter values. The results of the simulations can be presented in a matrix by means of the first simulation unit 16. The first simulation unit 16 has an interface (only indicated) via which the matrix is sent as input matrix to the first regression unit 18.

The first regression unit 18 is formed by a processor which is configured such that the input matrix can be converted in such a way that selected contents of the input matrix form results in a result matrix. By means of the configuration of the first regression unit 18 it is subsequently possible to describe a relationship between the converted input matrix and the result matrix in the form of a mathematical relationship. This mathematical relationship can be stored as a first coefficient matrix and sent via an interface (only indicated) of the first regression unit 18 to the first evaluation unit 22. Second switching time $t2_{coeff}$ and firing time $t3_{coeff}$ can be provided as coefficients of the first coefficient matrix by means of the first regression unit 18.

The first evaluation unit 22 is likewise formed by a processor whose configuration allows second switching times $t2_{out}$ and firing times $t3_{out}$ to be calculated by means of the coefficient matrix and by taking into account actual measurement values. The actual measurement values are transferred to the first evaluation unit 22 via an interface (only indicated) of the first measurement value unit 20. Further, a value of a desired discharge voltage $U_{wanted}$ can be sent via an interface to the first measurement value unit 20 and likewise transferred to the first evaluation unit 22 by the first measurement value unit 20.

The first evaluation unit 22 has a further interface via which the calculated second switching times $t2_{out}$ and firing times $t3_{out}$ are sent to the first control unit 24.

The first charging switch 10 and the first discharging switch 12 (see FIG. 2) can be triggered by the first control unit 24.

All of the possible embodiments of the first input unit 14, the first simulation unit 16, the first regression unit 18, the first measurement value unit 20, the first evaluation unit 22 and the control unit 24 also apply for the second units and other units to be mentioned in the following.

A first embodiment of the method according to the invention will be described in the following with reference to the first embodiment example shown in FIG. 1.

The method is divided into a non-time-critical method segment I and a time-critical method segment II. The non-time-critical method segment I is carried out before the time-critical method segment II is carried out. The results of the non-time-critical method segment I are in the form of a first coefficient matrix stored in the first regression unit 18 and can be retrieved repeatedly.

When carrying out the non-time-critical method segment I, first input parameters 31 are entered in the first input unit 14 by a user.

The first input parameters 31 change only slightly over a quantity of pulses of the resonant charging circuit 1. The first input parameters 31 are sent to the first simulation unit 16 as scalars.

Further, value ranges of second input parameters 32 changing stochastically from pulse to pulse are entered in the first input unit 14 and outputted as vectors to the first simulation unit 16.

Further, a second switching time $t2_{in}$ is entered in the first input unit 14 as a user-defined parameter value and is sent to the first simulation unit 16 as a scalar. First input parameters 31 and second input parameters 32 and user-defined parameter values make up the input values. In further embodiments, the second switching time $t2_{in}$ can also be indicated as a time range, in which case the second switching time $t2_{in}$ is then represented as a vector and entered.

A firing time $t3_{simul}$ and a desired discharge voltage $U_{wanted°simul}$ of a capacitor C of the resonant charging circuit (see FIG. 2) is simulated by means of the first simulation unit 16 based on the first input parameters 31, second input parameters 32 and the second switching time $t2_{in}$ for each combination of input parameters 31, 32 and of the second switching time $t2_{in}$. The results of the simulations are stored and sent to the first regression unit 18, where the results are arranged in an input matrix. In further embodiments, the input matrix can also be formed already by means of the first simulation unit 16.

The input matrix is supplemented by the second switching time $t2_{in}$ and the second input parameters 32 in the first regression unit 18 and converted such that the second switching time $t2_{in}$ and the firing time $t3_{simul}$ are expressed as results of the converted input matrix. The results are arranged in a result matrix. By applying selected methods of multidimensional regression, a mathematical relationship is determined between the converted input matrix and the result matrix in the form of a coefficient matrix. The coefficient matrix describes a functional relationship between the converted input matrix and the result matrix. The coefficient matrix is stored so as to be retrievable.

The steps of the non-time-critical method segment I described so far are used for constructing and supplying a schematic array of coefficients which are needed for calculating the second switching time $t2_{out}$ and firing time $t3_{out}$ in a time-critical method segment II.

When carrying out the time-critical method segment II, measurement values are acquired at the resonant charging circuit 1 and are arranged in a first measurement value matrix in the first measurement value unit 20. The measurement values usually change from pulse to pulse without being subject to long-term drift. Further, a value of the desired voltage $U_{wanted}$ of the capacitor C is assigned to the first measurement value matrix.

The first measurement value matrix is loaded in the first evaluation unit 22. The first coefficient matrix contains coefficients $t2_{coeff}$ for calculating the second switching time $t2_{out}$ and coefficients $t3_{coeff}$ for calculating the firing time $t3_{out}$. The measurement value matrix is multiplied by the coefficient matrix. In so doing, the measurement values of the first measurement value matrix and the coefficients of the first coefficient matrix are selected and arranged in the respective matrices in such a way that it is possible to multiply by the rules of matrix computation.

As a result of the multiplication of the matrices, the second switching time $t2_{out}$ and the firing time $t3_{out}$ are calculated and are sent to the first control unit 24 by means of which the resonant charging circuit 1 (see FIG. 2) is triggered.

Figure 2:
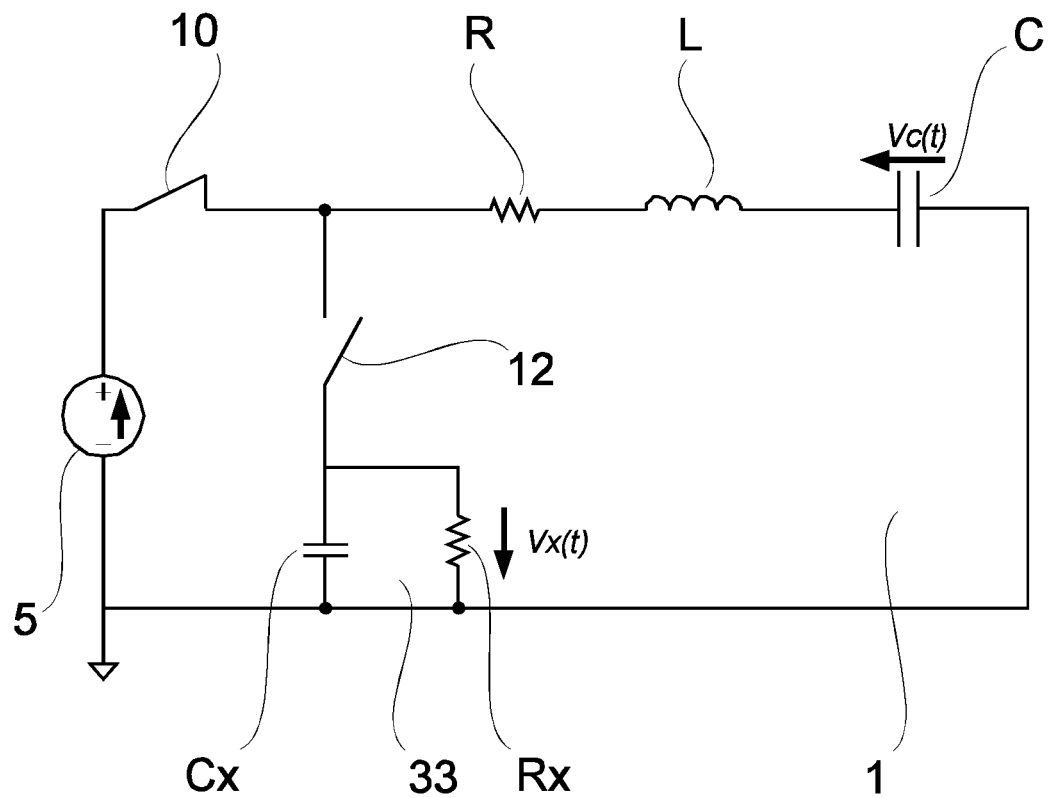
FIG. 2 is a simplified schematic diagram of a first resonant charging circuit.

A wiring diagram, shown in FIG. 2, of a first resonant charging circuit 1 which can be triggered by means of a method according to the invention and a device according to the invention comprises a first voltage source 5 with which a first charging switch 10 (shown in closed state), a resistance R, an inductance L and a capacitance C are connected in series, and a protection circuit 33 which is arranged parallel to the first voltage source 5 and which has a first discharging switch 12 (shown open), a capacitor Cx and a resistor Rx connected in parallel with the latter. A time-variable voltage Vx(t) is applied to the protective circuit. A time-variable voltage (designated by Vc(t)) is applied to the capacitor. The basic circuit illustrated in FIG. 2 also applies to the following embodiment examples (see FIGS. 3 and 7).

By closing the first charging switch 10, the capacitor C can be charged by the first radiation source 5. When the first charging switch 10 is opened, the charging of the capacitor C is concluded. A simultaneous closing of the first discharging switch 12 allows a freewheeling of the charging current and prevents unwanted voltage spikes. Further, the closed first discharging switch 12 causes a continued charging of the capacitor C.

Figure 3:
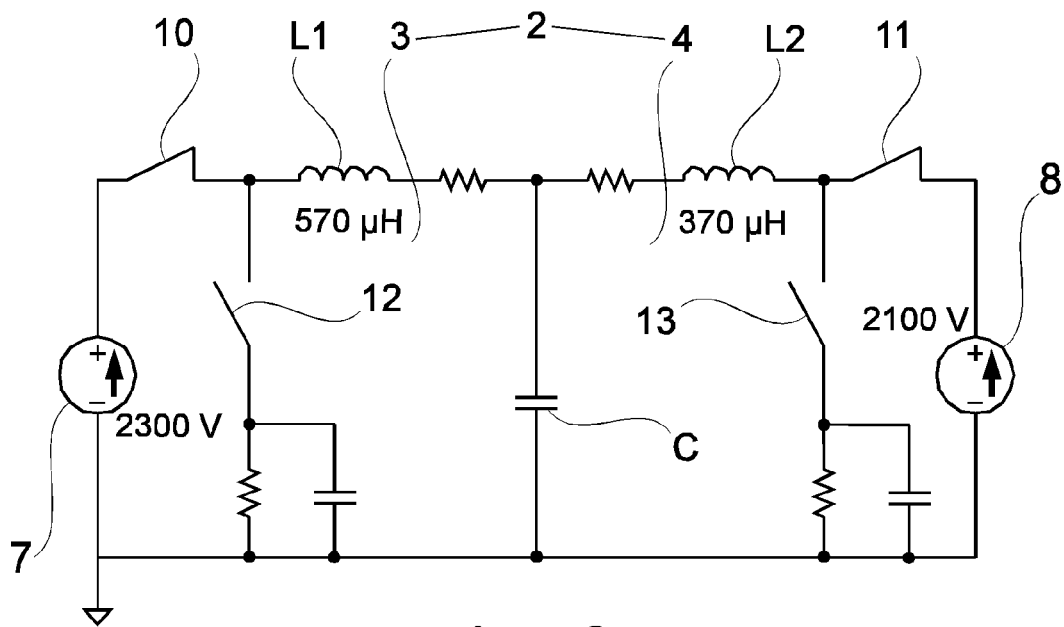
FIG. 3 is a simplified schematic diagram of a first embodiment example of an expanded resonant charging circuit with different inductance values.

FIG. 3 shows a first embodiment example of an expanded resonant charging circuit 2 which comprises a first resonant charger 3 with a first inductance L1 and a second resonant charger 4 with a second inductance L2. The first resonant charger 3 is supplied with a first supply voltage 7 in the amount of 2300 V and comprises a first charging switch 10 and a first discharging switch 12. The second resonant charger 4 comprises a second charging switch 11 and a second discharging switch 13 and is operated by a second supply voltage 8 of 2100 V. The capacitor C is to be charged by the two resonant chargers 3, 4. The first inductance L1 is 570 μH, the second inductance L2 is 370 μH. With respect to their specific parameter values, therefore, the first resonant charger 3 and the second resonant charger 4 are asymmetrical with respect to one another.

Figure 4:
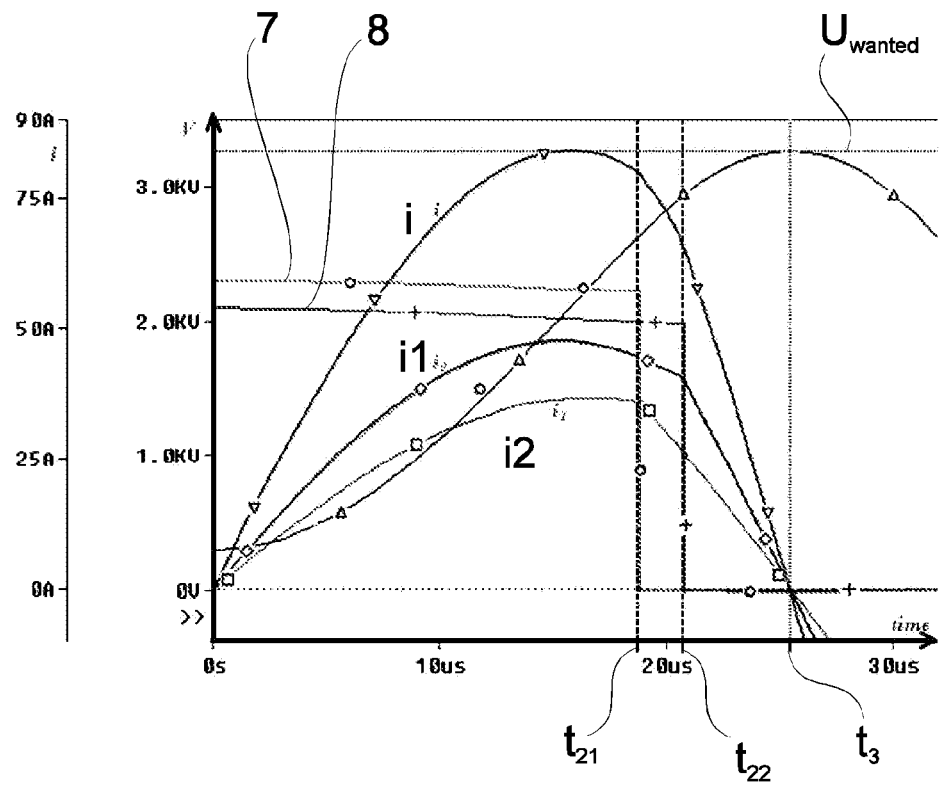
FIG. 4 are graphs of some voltage curves of the expanded resonant charging circuit.

The voltage curves and current curves of the expanded resonant charging circuit 2 according to FIG. 3 are shown by way of example in FIG. 4 as voltages [kV] and currents [A] plotted over time [μs]. A highest possible discharge voltage is applied to the capacitor C when electric currents i, i1 and i2 no longer flow in the expanded resonant charging circuit 2 and the graphs of electric currents i, i1 and i2 intersect the abscissa at an ordinate value of zero (zero crossing). The second switching time t21 (switchover time) of the first resonant charger 3 and the second switching time t22 of the second resonant charger 4 are selected in such a way that the electric currents i, i1 and i2 have a common zero crossing. At the time of the zero crossing, the desired voltage $U_{wanted}$ is at a maximum. This time indicates the firing time t3. The first supply voltage 7 and second supply voltage 8 are entered.

Figure 5:
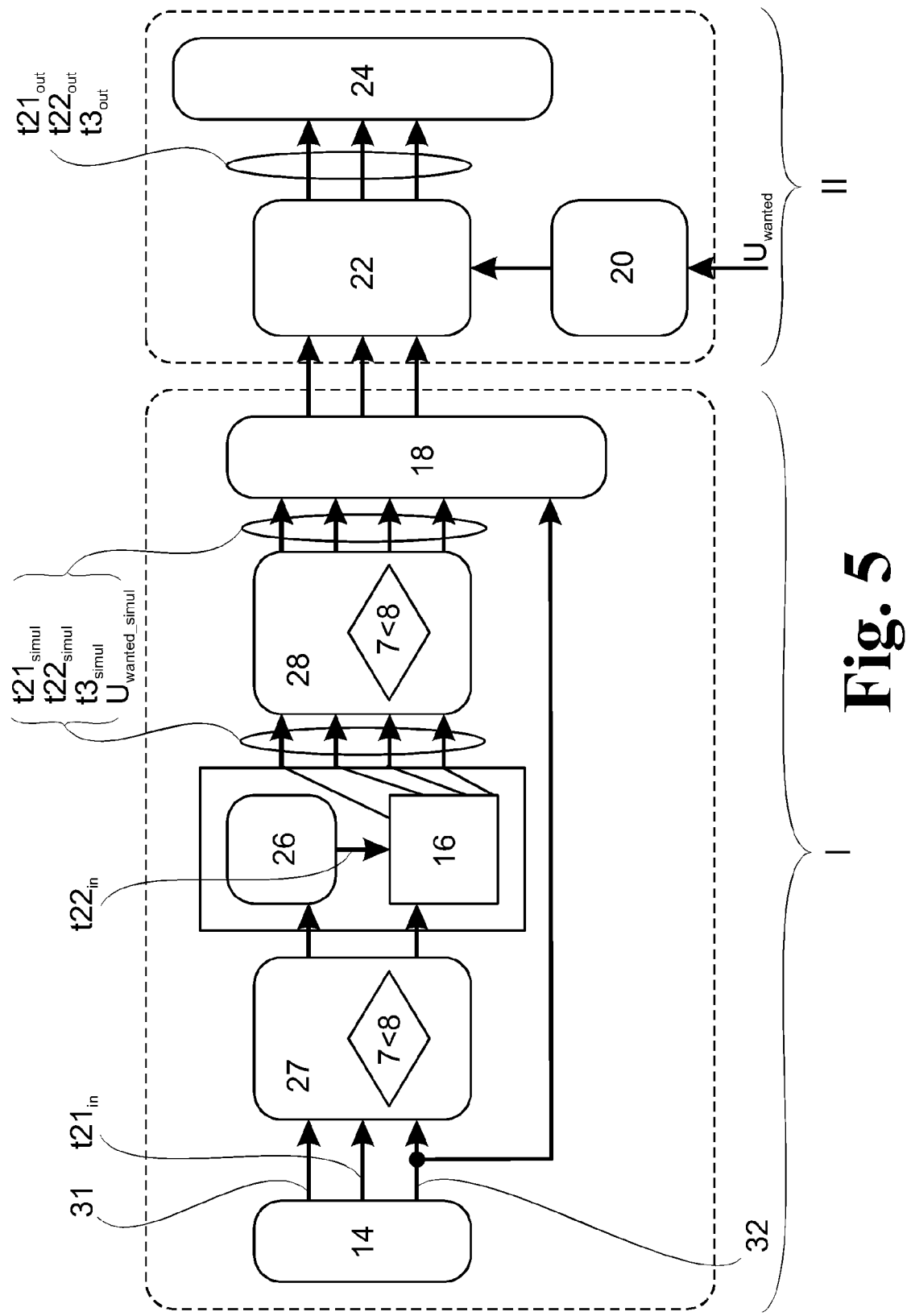
FIG. 5 is a block diagram of a second embodiment of a device according to the invention for triggering the expanded resonant charging circuit.

A second embodiment of a device according to the invention for triggering the expanded resonant charging circuit 2 is shown in the schematic diagram in FIG. 5. A first comparison unit 27 is arranged between the first input unit 14 and the first simulation unit 16, and a second comparison unit 28 is arranged between the first simulation unit 16 and the first regression unit 18. Further, a logic unit 26 is connected via interfaces to the first comparison unit 27 and the first simulation unit 16. One of the interfaces of the first input unit 14 serves only to send the second input parameters 32 to the first regression unit 18.

The first comparison unit 27 is configured in such a way that it can execute two essential functions. The first of these is to compare the two supply voltages 7, 8 (represented symbolically; see also FIGS. 3 and 4) and determine which of the two supply voltages 7, 8 is the greater. A second switching time t21 of the first resonant charger 3 is assigned to the resonant charger 3, 4 having the higher supply voltage 7, 8. The second switching time t21 may also possibly be assigned to the second resonant charger 4. Due to the configuration of the first comparison unit 27, a topology of the expanded resonant charging circuit 2 is subsequently generated in which specific parameter values of the resonant chargers 3, 4 are compiled according to which the topology is symmetrical with respect to the specific parameter values. For this purpose, the specific parameter values of the resonant charger 3, 4 with the higher supply voltage 7, 8 are assigned to the two resonant chargers 3, 4. The generated symmetrical topology is sent to the logic unit 26 via interfaces of the first comparison unit 27, while the first and second input parameters 31, 32 and the user-defined second switching time $t21_{in}$ are sent to the first simulation unit 16 via a further interface.

The logic unit 26 allows the simulation of the symmetrical topology of the expanded resonant charging circuit 2 and the simulation of the second switching time $t22_{simul}$ of the second resonant charger 4. The second switching time t22 of the second resonant charger 4 is sent to the first simulation unit 16 as second switching time $t22_{in}$ via an interface (only indicated).

The second comparison unit 28 is configured in such a way that it carries out a new comparison of the first and second supply voltages 7, 8. The second switching times t21 and t22 are again assigned to the first and second resonant chargers 3, 4 based on the comparison.

In contrast to the methods described above, additional steps are carried out in a method shown in FIG. 5. The amounts of the first and second supply voltages 7, 8 are compared to one another by means of the first comparison unit 27 and it is determined which of the supply voltages is greater in amount. A second switching time $t21_{in}$ (switchover time) (not shown) at which the first charging switch 10 and second charging switch 11 are to be opened and the first discharging switch 12 and second discharging switch 13 are to be closed is assigned to the charging switch 10, 11 of the resonant charger 3, 4 with the greater supply voltage 7, 8 (see FIG. 3).

After the second switching time $t2_{in}$ is assigned, the specific parameter values, such as inductances, capacitances and resistances, of the resonant charger with the greater supply voltage 7, 8 are used to simulate a symmetrical topology by means of the logic unit 26.

Second switching times t21, $t22_{simul}$, a firing time $t3_{simul}$ and a desired discharge voltage $U_{wanted.simul}$ are supplied by the first simulation unit 16. The second switching times $t21_{out}$, $t22_{out}$ and the firing time $t3_{out}$ are sent to the control unit 24 by the first evaluation unit 22.

Figure 6:
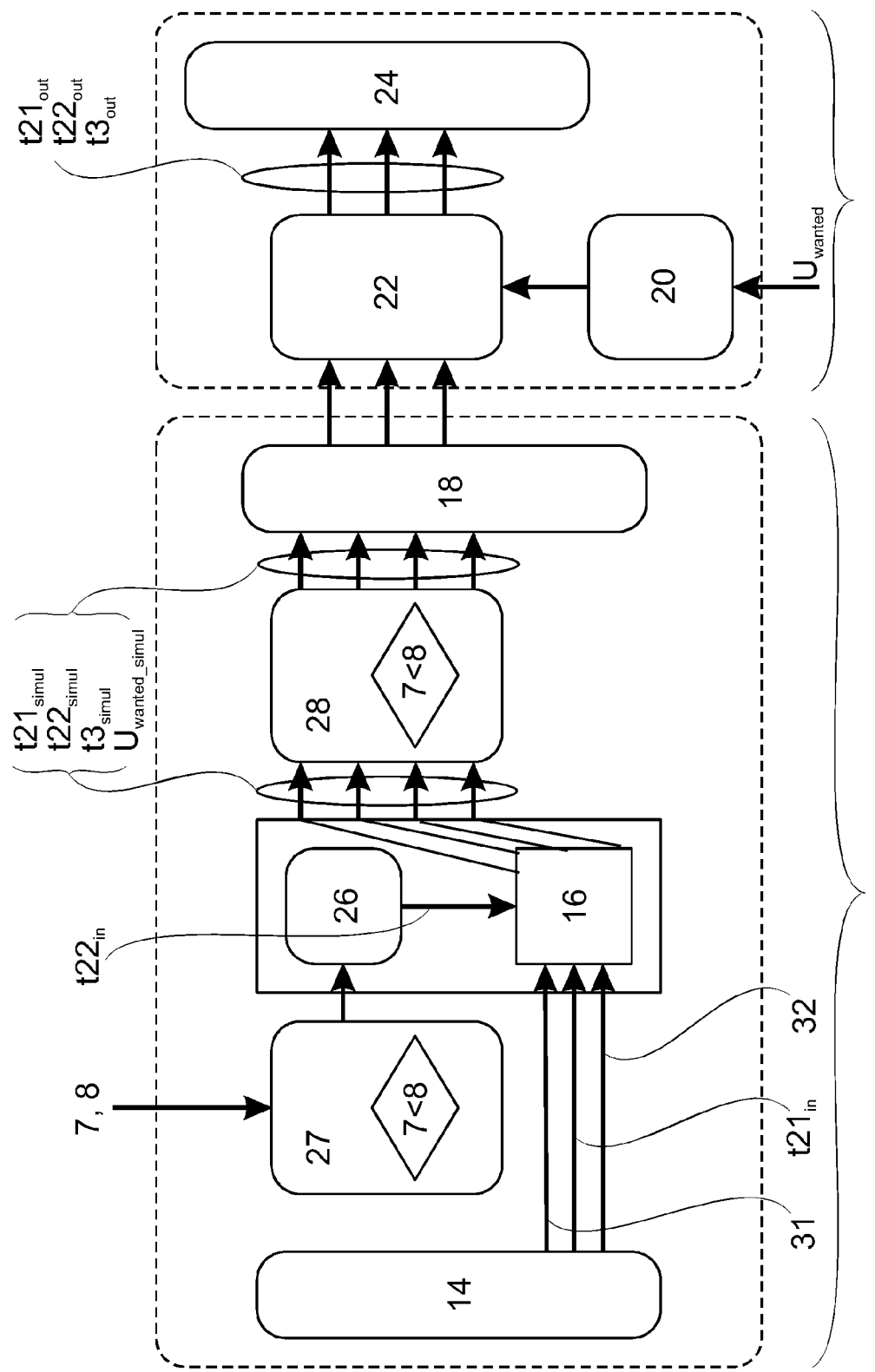
FIG. 6 is a block diagram of a third embodiment of a device according to the invention for triggering the expanded resonant charging circuit.

The schematic diagram of a third embodiment of a device according to the invention for triggering the expanded resonant charging circuit 2 according to FIG. 6 shows that a second comparison unit 28 is arranged between the first simulation unit 16 and the first regression unit 18. Further, a logic unit 26 is connected via interfaces to the first comparison unit 27 and the first simulation unit 16. One of the interfaces of the first input unit 14 serves only to send the second input parameters 32 to the first regression unit 18. The first input unit 14 is connected to the first simulation unit 16. The first and second input parameters 31, 32 and the user-defined second switching time $t21_{in}$ are sent to the first simulation unit 16 via an interface.

A first comparison unit 27 is configured in such a way that it can execute two essential functions. The first of these is to compare the two supply voltages 7, 8 (represented symbolically; see also FIGS. 3 and 4) and determine which of the two supply voltages 7, 8 is the greater. A second switching time t21 of the first resonant charger 3 is assigned to the resonant charger 3, 4 having the higher supply voltage 7, 8. The second switching time t21 may also possibly be assigned to the second resonant charger 4. Due to the configuration of the first comparison unit 27, a topology of the expanded resonant charging circuit 1 is subsequently generated in which specific parameter values of the resonant chargers 3, 4 are compiled according to which the topology is symmetrical with respect to the specific parameter values. For this purpose, the specific parameter values of the resonant charger 3, 4 with the higher supply voltage 7, 8 are assigned to the two resonant chargers 3, 4. The generated symmetrical topology is sent to the logic unit 26 via interfaces of the first comparison unit 27.

The logic unit 26 allows the simulation of the symmetrical topology of the resonant charging circuit 1 and the simulation of the second switching time $t22_{simul}$ (not shown) of the second resonant charger 4. The second switching time t22 of the second resonant charger 4 is sent to the first simulation unit 16 as second switching time $t22_{in}$ via an interface (only indicated).

The second comparison unit 28 is configured in such a way that it carries out a new comparison of the first and second supply voltages 7, 8. The second switching times t21 and t22 are again assigned to the first and second resonant chargers 3, 4 based on the comparison.

The amounts of the first and second supply voltages 7, 8 are compared to one another by means of the first comparison unit 27 and it is determined which of the supply voltages is greater in amount. A second switching time $t21_{in}$ (switchover time) (not shown) at which the first charging switch 10 and second charging switch 11 are to be opened and the first discharging switch 12 and second discharging switch 13 are to be closed is assigned to the charging switch 10, 11 of the resonant charger 3, 4 with the greater supply voltage 7, 8 (see FIG. 3).

After the second switching time $t2_{in}$ is assigned, the specific parameter values, such as inductances, capacitances and resistances, of the resonant charger with the greater supply voltage 7, 8 are used to simulate a symmetrical topology by means of the logic unit 26.

Second switching times $t21_{simul}$, $t22_{simul}$, a firing time $t3_{simul}$ and a desired discharge voltage $U_{wanted.simul}$ are supplied by the first simulation unit 16. The second switching times $t21_{out}$, $t22_{out}$ and the firing time $t3_{out}$ are sent to the control unit 24 by the first evaluation unit 22.

Figure 7:
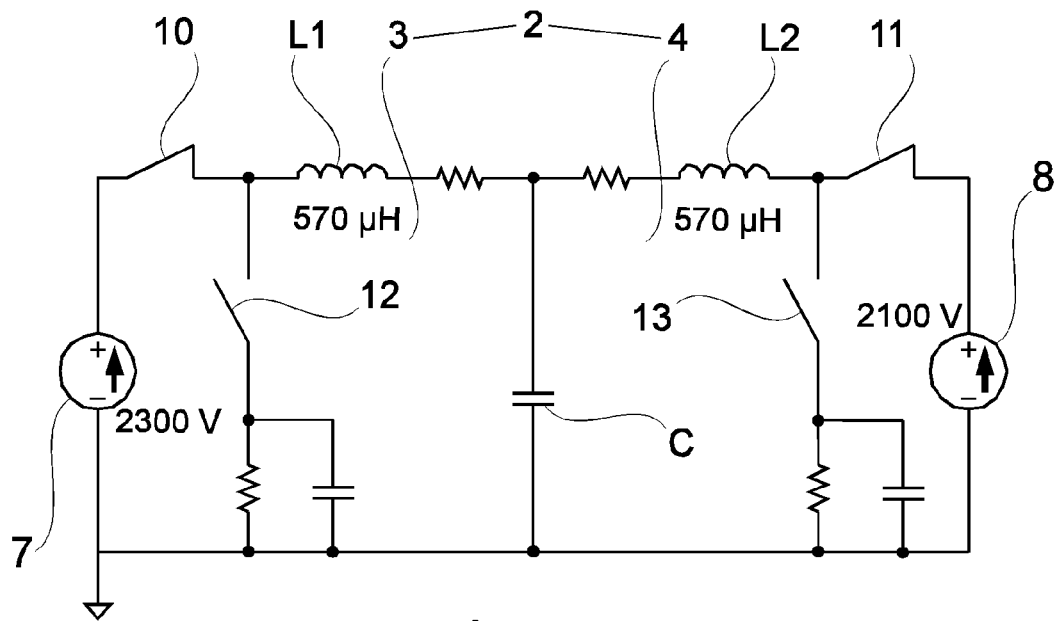
FIG. 7 is a simplified schematic diagram of a second resonant charging circuit with inductances of the same value.

A symmetrical topology of this kind is shown in FIG. 7. The two resonant chargers 3, 4 both have identical inductances L1=L2=570 µH. In other respects, the resonant charging circuit 2 corresponds to the circuit shown in FIG. 3.

Figure 8:
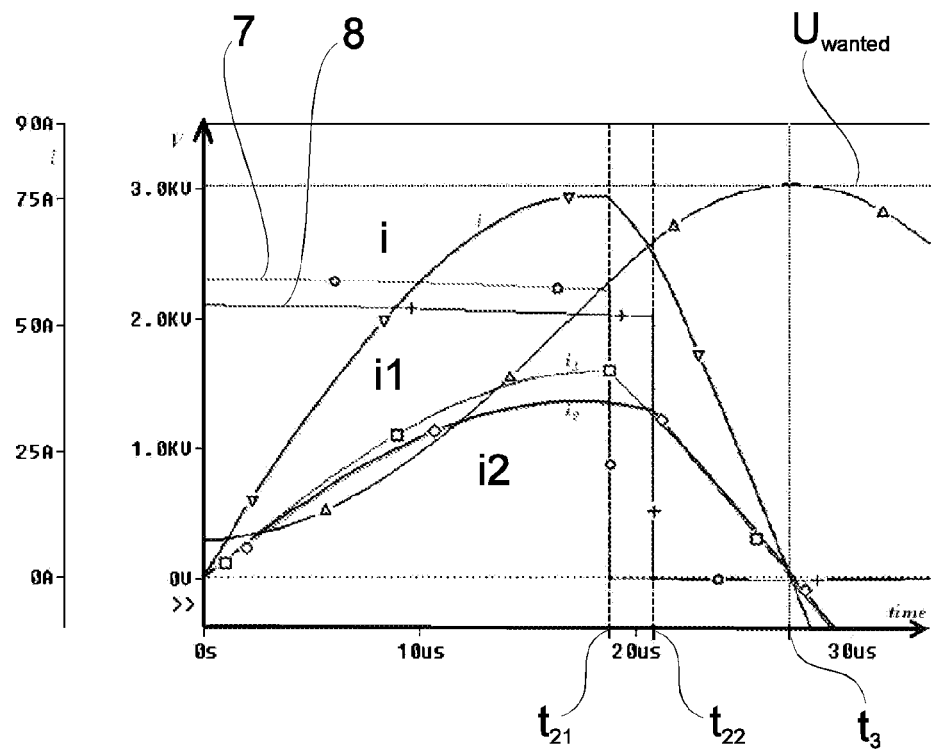
FIG. 8 are graphs of some voltage curves and current curves of the second resonant charging circuit.

FIG. 8 illustrates the determination of the second switching time t22 by means of the logic unit 26 with reference to the symmetrical topology of the resonant charging circuit 2 shown in FIG. 7. Current i1 of the first resonant charger 3 which also has the higher supply voltage 7 (2300 V) is higher than current i2 of the second resonant charger 4 having the lower supply voltage 8 (2100 V). At the second switchover time t21, the first charging switch 10 is opened and the first discharging switch 12 is closed. At this second switching time t21, the current i1 starts to drop and at a later time reaches a value that is equal to the value of current i2. This later time is determined as second switching time t22 at which the second charging switch 11 is opened and the second discharging switch 13 is closed.

Figure 9:
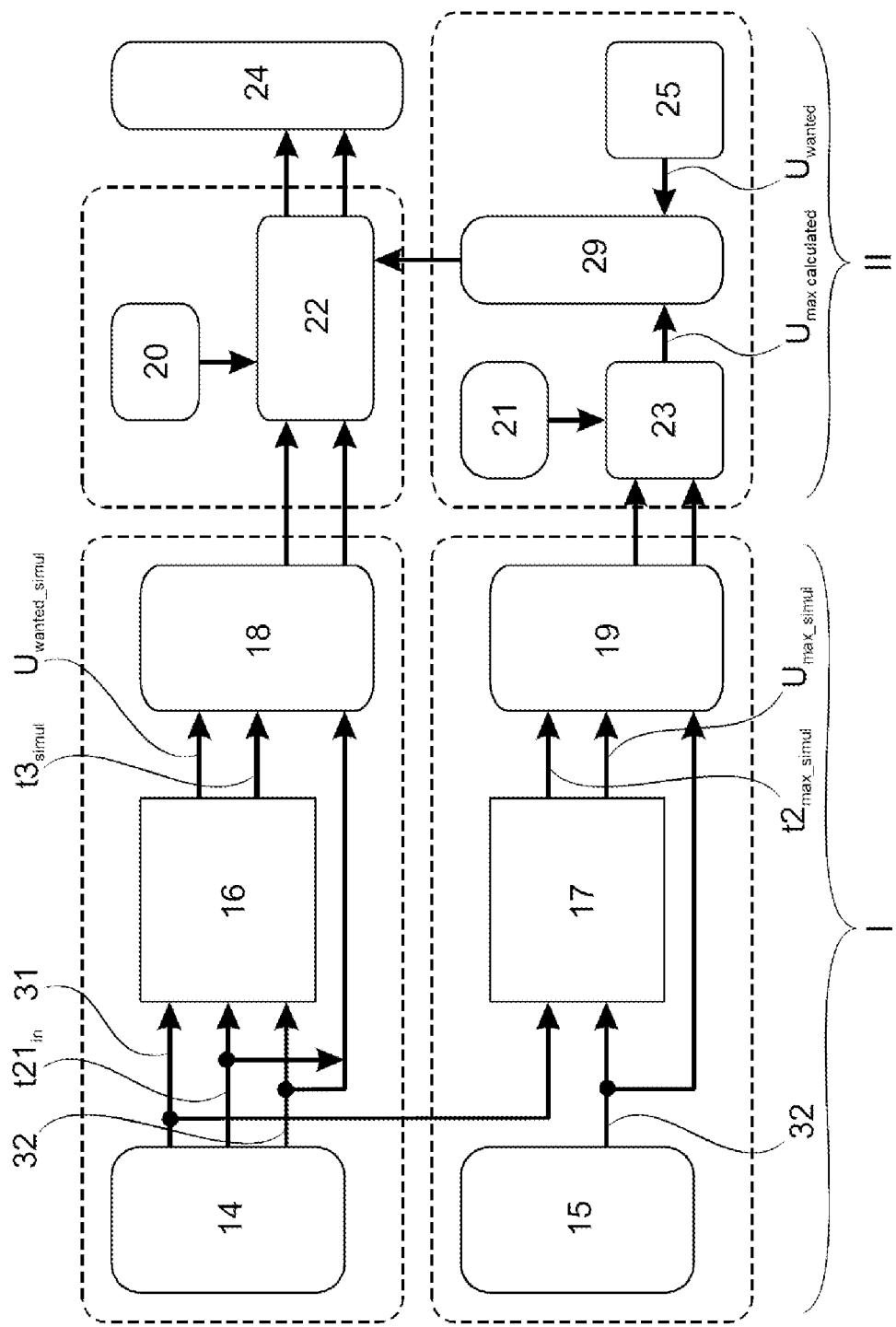
FIG. 9 is a block diagram of a fourth embodiment of a device according to the invention for triggering a resonant charging circuit.

In a fourth embodiment example of the device according to the invention shown in FIG. 9, a second input unit 15, a second simulation unit 17, a second regression unit 19, a second evaluation unit 23, a second measurement value unit 21, a third comparison unit 29 and a third input unit 25 are provided in addition to the elements described in the first embodiment example.

The arrangement and functioning of the second input unit 15, the second simulation unit 17 and the second regression unit 19 basically correspond to the first input unit 14, the first simulation unit 16 and the first regression unit 18. The second simulation unit 17 serves to determine a maximum discharge voltage $U_{max\ simul}$ and a second switching time $t2_{max\ stimuli}$ by means of which a maximum discharge voltage $U_{max}$ (not shown) can be achieved.

Only second input parameters 32 are sent to the second simulation unit 17 and to the second regression unit 19 via an interface of the second input unit 15. First input parameters 31 are sent via interface to the second simulation unit 17 from the first input unit 14.

A maximum discharge voltage $U_{max\ calculated}$ that can be achieved with the actual measurement values can be calculated by the second evaluation unit 23. The actual measurement values go from the second measurement value unit 21 to the second evaluation unit 23 via an interface.

The third comparison unit 29 obtains a desired value of the discharge voltage $U_{wanted}$ from the third input unit 25 and the calculated maximum achievable discharge voltage $U_{max\ calculated}$ from the second evaluation unit 23. The two discharge voltages $U_{wanted}$, $U_{max}$ calculated can be compared by means of the third comparison unit 29 and the results of the comparison are sent to the first evaluation unit 22 via an interface.

In a third embodiment of the method according to the invention, the maximum achievable discharge voltage $U_{max\ simul}$ and the associated second switching time $t2_{max\ simul}$ are determined by means of the device shown in FIG. 9 in the non-time-critical method segment I by the second simulation unit 17. A second coefficient matrix is formed by the second regression unit 19 and is retrievably stored.

In the time-critical method segment II, actual measurement values of the resonant charging circuit 1 are measured and sent to the second evaluation unit 23 by the second measurement value unit 21. The measurement values are multiplied by the second coefficient matrix, and the discharge voltage $U_{max\ calculated}$ which can be achieved based on the actual measurement values is calculated. The calculated discharge voltage $U_{max\ calculated}$ is sent to the third comparison unit 29 and compared with the entered desired discharge voltage $U_{wanted}$. The discharge voltage having the smaller amount is selected and fed to the first evaluation unit 22.

Figure 10:
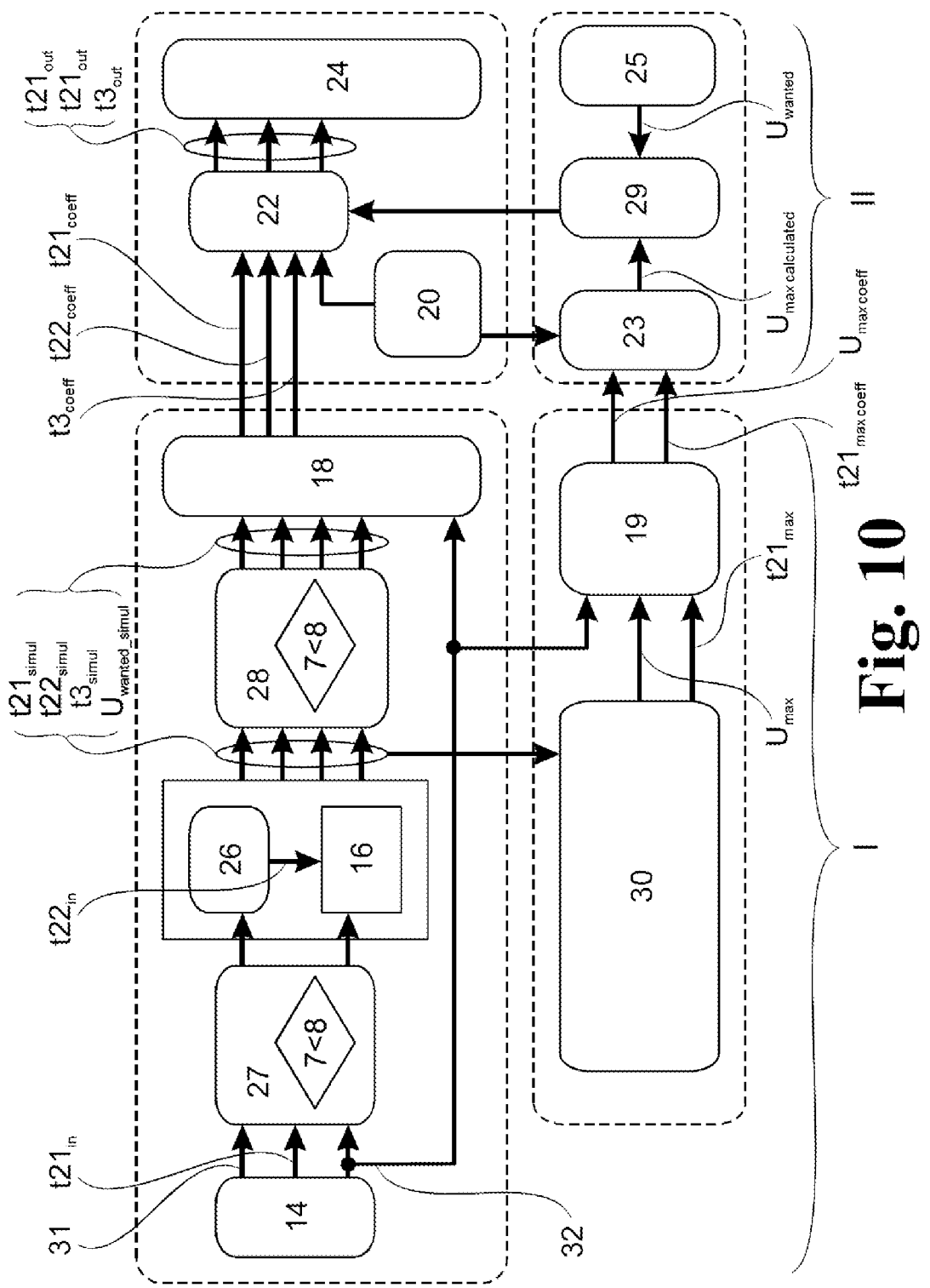
FIG. 10 is a block diagram of a fifth embodiment example of a device according to the invention for triggering a resonant charging circuit.

FIG. 10 shows a fifth embodiment of the device according to the invention. This embodiment has all of the elements of the second embodiment (see FIGS. 3 to 5). In addition, second regression unit 19, the second evaluation unit 23, the third comparison unit 29, the third input unit 25 and a mathematical modeling unit 30 are provided.

The mathematical modeling unit 30 has an interface via which the simulated data of the first simulation unit 16 are sent as input data to the mathematical modeling unit 30. The mathematical modeling unit 30 is configured in such a way that a maximum achievable discharge voltage $U_{max}$ and a second switchover time $t21_{max}$ required for adjusting the maximum achievable discharge voltage $U_{max}$ are determined based on the input data using polynomial regression methods. Another interface is provided at the mathematical modeling unit 30 via which the determined values of the maximum achievable discharge voltage $U_{max}$ and second switchover time $t21_{max}$ are fed to the second regression unit 19. Further, the second regression unit 19 is sent second input parameters 32 of the first input unit 14.

When carrying out the method according to the invention by means of the device which is shown schematically in FIG. 10, all of the steps of the method up to the preparation of the first coefficient matrix are implemented in the same way as in the second embodiment example of the method according to the invention (see FIGS. 3 to 5). The simulated data of the switchover times $t21_{simul}$, $t22_{simul}$, of the second switching time $t3_{simul}$ and of the desired voltage $U_{wanted\ simul}$ are sent via interfaces to the first regression unit 18 and to the mathematical modeling unit 30. The maximum achievable discharge voltage $U_{max}$ and the second switching time $t21_{max}$ are determined as function of $t3_{simul}$ and $t22_{simul}$ by means of the mathematical modeling unit 30 and are sent to the second regression unit 19 as second input matrix. The maximum achievable discharge voltage $U_{max}$ and the second switching time $t21_{max}$ are present when switchover time t22 coincides with firing time t3 and, therefore, the condition t22−t3=0 is met (see FIG. 11). A second coefficient matrix which describes the relationship of the second input matrix to a second result matrix is formed from the second input matrix by means of the second regression unit 19. The second result matrix was formed by converting from the second input matrix, wherein the maximum achievable discharge voltage $U_{max}$ and the second switching time $t21_{max}$ which is required for achieving the maximum achievable discharge voltage $U_{max}$ are used as results of the second result matrix. The second coefficient matrix contains the coefficients $U_{max\ coeff}$ and $t21_{max\ coeff}$ and is stored and retrievably provided.

In the second method segment II, the second coefficient matrix is multiplied by a first measurement value matrix which is provided by the first measurement value unit 20 and the first and second evaluation unit 22, 23. The maximum achievable discharge voltage $U_{max°calculated}$ which is calculated by means of the second evaluation unit 23 is sent to the third comparison unit 29 and compared with a desired discharge voltage $U_{wanted}$ which was sent to the second evaluation unit 23 by the third input unit 25. The smaller of the two compared discharge voltages $U_{max\ calculated}$ and $U_{wanted}$ in terms of amount is sent via an interface to the first evaluation unit 22 for calculating the switchover times $t21_{out}$, $t22_{out}$ and $t3_{out}$.

The fourth and fifth embodiment examples can be considered as parallel calculation paths in which coefficients of the switchover times and of the firing time t3 are determined on a first path and a discharge voltage $U_{max\ calculated}$ and $U_{wanted}$ are determined on the second path for calculating the second switching time, the switchover times and the firing time t3.

By means of the fifth possible embodiment of the method according to the invention, a first coefficient matrix with $t21_{coeff}$, $t22_{coeff}$ and $t3_{coeff}$ and a second coefficient matrix with $t21_{max\ coeff}$ and $U_{max\ coeff}$ are formed and supplied in the non-time-critical method segment I. The first coefficient matrix and second coefficient matrix can be determined and provided one after the other or simultaneously.

Figure 11:
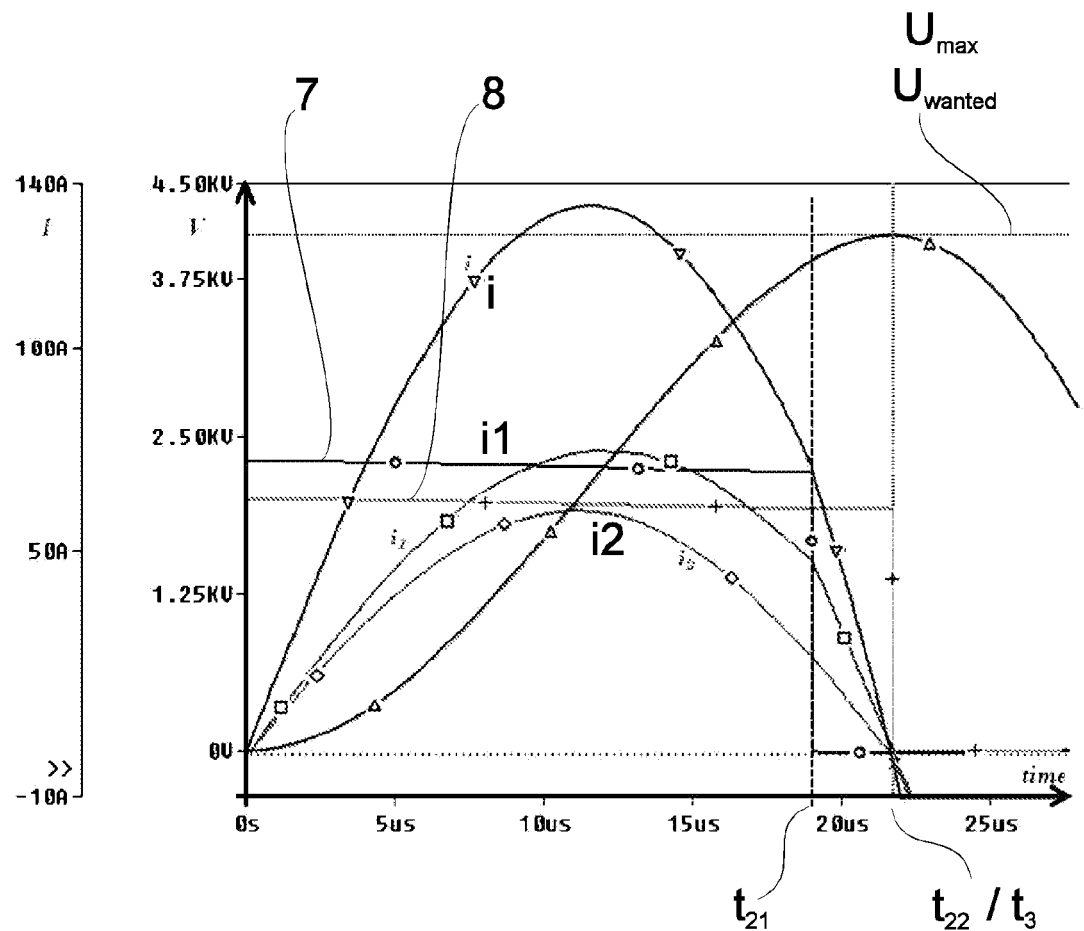
FIG. 11 are graphs of some voltage curves and current curves of the fifth embodiment example of the resonant charging circuit.

Referring to the fifth embodiment example (FIG. 10), FIG. 11 shows that the maximum achievable discharge voltage $U_{max}$ corresponds to the desired discharge voltage $U_{wanted}$. Because of the condition t22–t3=0 which must be met, the firing time t3 is also assigned to a time at which the maximum achievable discharge voltage $U_{max}$/the desired discharge voltage $U_{wanted}$ is achieved.

REFERENCE NUMERALS

1 resonant charging circuit
2 expanded resonant charging circuit
3 first resonant charger
4 second resonant charger
5 first voltage source
6 second voltage source
7 first supply voltage
8 second supply voltage
10 first charging switch
11 second charging switch
12 first discharging switch
13 second discharging switch
14 first input unit
15 second input unit
16 first simulation unit
17 second simulation unit
18 first regression unit
19 second regression unit
20 first measurement value unit
21 second measurement value unit
22 first evaluation unit
23 second evaluation unit
24 control unit
25 third input unit
26 logic unit
27 first comparison unit
28 second comparison unit
29 third comparison unit
30 mathematical modeling unit
31 first input parameter
32 second input parameter
33 protection circuit
R resistance
Rx resistance (of the protection circuit)
C capacitance (of the resonant charger)
Cx capacitance (of the protection circuit)
L1 first inductance
L2 second inductance
I non-time-critical method segment
II time-critical method segment
t1 first switching time
t2 second switching time
t3 firing time
$U_{wanted}$ desired discharge voltage
$U_{max}$ maximum achievable discharge voltage

What is claimed is:

1. A method for triggering a resonant charging circuit for a device for generating short-wavelength radiation based on a pulsed discharge plasma, the method comprising:
   determining switching times of the resonant charging circuit in a non-time-critical method segment (I) by simulation;
   storing values of the switching times to be repeatedly retrievable;
   determining measurement values of the resonant charging circuit in real time in a time-critical method segment;
   determining at least one second switching time (t2) at which a discharging switch of the resonant charging circuit is triggered to supply a discharge voltage ($U_{wanted}$) for generating the discharge plasma, and calculating the firing time (t3) at which a discharge plasma at the discharge voltage ($U_{wanted}$) is generated; and
   triggering the resonant charging circuit;
   further comprising the following steps in the non-time-critical method segment (I):
   A1) providing input values;
   B1) simulating values comprising at least one firing time ($t3_{simul}$) and a desired discharge voltage ($U_{wanted\ simul}$) of a charging capacitor (C) by means of simulation for every combination of input values;
   C1) forming an input matrix from all of the combinations of input values and the respective simulated values;
   D1) converting the input matrix and forming switching times ($t2_{simul}$) in a result matrix, the switching times ($t2_{simul}$) being selected from the input matrix for triggering a charging switch serving to charge the charging capacitor (C) and for triggering the discharging switch; and
   E1) determining a relationship between the converted input matrix and the result matrix and retrievably storing the mathematical relationship in the form of a coefficient matrix.

2. A method according to claim 1, wherein the simulation of the non-time-critical method segment (I) is based on input values formed by user-defined parameter values and by at least one user-predefined second switching time ($t2_{in}$).

3. The method according to claim 2, wherein the user-defined parameter values comprise first input parameters which are variable gradually over a quantity of pulses, and second input parameters which are variable from pulse to pulse.

4. The method according to claim 1, further comprising the following steps in the time-critical method segment (II):

F1) forming a first measurement value matrix from measurement values acquired in the time-critical method segment (II);

G1) providing at least one user-defined value of a desired discharge voltage ($U_{wanted}$) and adding the value to the first measurement value matrix;

H1) multiplying the coefficient matrix by the first measurement value matrix; and I1) calculating at least the second switching time (t2) and the firing time (t3).

5. The method according to claim 4, wherein the resonant charging circuit is an expanded resonant charging circuit with at least two resonant chargers, and wherein the at least two resonant chargers are operated with a respective supply voltage and are provided in each instance with a charging switch.

6. The method according to claim 5, further comprising additional steps at step A1 for adapting the input values to the expanded resonant charging circuit while assigning a second switching time (t21) to one of the resonant chargers and by calculating a second switching time (t22) of the other resonant charger:

a1) comparing the amounts of the supply voltages;

a2) assigning a user-defined second switching time ($t21_{in}$) to the charging switch of the resonant charger having a higher amount of the supply voltage, wherein the charging switch of the higher-voltage-supplied resonant charger is opened, and wherein the discharging switch of the higher-voltage-supplied resonant charger is closed at the user-defined second switching time ($t21_{in}$);

a3) generating a topology of the expanded resonant charging circuit with symmetrically compiled first input parameters using the first input parameters of the resonant charger having the higher amount of supply voltage; and a4) calculating an additional second switching time ($t22_{simul}$) based on the topology, at which second switching time (t22) the charging switch of the resonant charger having the lower amount of supply voltage is opened and the discharging switch of this resonant charger is closed, and providing the additional second switching time ($t22_{simul}$) as second switching time ($t22_{in}$) for the simulation; wherein the amounts of the supply voltages are compared between steps B1 and C1 and a provided simulated second switching time ($t21_{simul}$) simulated in step B1 is assigned to the resonant charger having the lower amount of supply voltage, the provided second switching time ($t22_{simul}$) simulated in step B1 is assigned to the resonant charger having the higher amount of supply voltage, and in step D1, the result matrix is resolved for the simulated switching times ($t21_{simul}$) and ($t22_{simul}$) and the simulated firing time ($t3_{simul}$).

7. The method according to claim 4, further comprising comparing a desired discharge voltage ($U_{wanted}$) with an achievable maximum discharge voltage ($U_{max}$), and adding the smaller discharge voltage ($U_{wanted}$, $U_{max}$) to the first measurement value matrix.

8. The method according to claim 7, wherein a further process according to steps A2 to E2 is carried out in the non-time-critical method segment, comprising:

supplying input values in step A2;

simulating in step B2 a maximum achievable discharge voltage ($U_{max\ simul}$) and a second switching time ($t2_{max\ simul}$) at which the maximum achievable discharge voltage ($U_{max\ simul}$) is achieved;

forming a second input matrix in step C2;

converting the second input matrix in step D2 to form the second switching time ($t2_{max\ simul}$) and the maximum achievable discharge voltage ($U_{max\ simul}$) in a second result matrix; and determining in step E2 and retrievably storing a second coefficient matrix for describing the relationship between the converted second input matrix and the second result matrix.

9. The method according to claim 7, wherein a further process according to step F2 is carried out in the time-critical method segment:

forming a second measurement value matrix in step F2; is formed, carrying out step f1 after step F2, step f1 comprising multiplying the second coefficient matrix by the second measurement value matrix, and calculating at least one value of a maximum achievable discharge voltage ($U_{max\ calculated}$); and carrying our step f2 after step F2, step comprising comparing the value of the maximum achievable discharge voltage ($U_{max\ calculated}$) with the value of the desired discharge voltage ($U_{wanted}$), and providing the smaller-amount value of the compared discharge voltages ($U_{max\ calculated}$, $U_{wanted}$) for calculating at least the second switching time (t2).

10. The method according to claim 8, wherein a further process according to a further process with steps C2 to E2 carried out in the non-time-critical method segment (I), comprises:

in a step c2-1 preceding step C2, determining the maximum achievable discharge voltage ($U_{max\ calculated}$) and a second switching time ($t21_{max}$);

forming a second input matrix in step C2;

converting the second input matrix in step D2 to form the maximum achievable discharge voltage ($U_{max\ calculated}$) and the second switching time ($t21_{max}$) as results of the resolved second input matrix in a second result matrix; and in step E2 determining a mathematical relationship between the converted second input matrix and the second result matrix, and retrievably storing the mathematical relationship in the form of a second coefficient matrix.

11. The method according to claim 10, wherein a further process according to the step F2 carried out in the time-critical method segment (II) comprises:

in step F2, using the measurement value matrix from step F1;

carrying out step f1 after step F2 by multiplying the second coefficient matrix by the first measurement value matrix, and calculating at least one value of a maximum achievable discharge voltage ($U_{max\ calculated}$);

carrying out a further step f2 after step F2 by comparing the value of the maximum achievable discharge voltage ($U_{max\ calculated}$) with the value of the desired discharge voltage ($U_{wanted}$), and selecting the smaller-amount value of the compared discharge voltages and adding it to the first measurement value matrix for use in the first evaluation unit.

12. A device for triggering a resonant charging circuit in a device for generating short-wavelength radiation based on a pulsed discharge plasma, the device for comprising:

at least one charging switch for charging a charging capacitor (C) of the resonant charging circuit and at least one discharging switch for discharging the charging capacitor (C) of the resonant charging circuit;

a first input unit for entering input values formed by user-defined parameter values and by at least one user-predefined second switching time (t2);

a first simulation unit for simulating at least one switching time (t21, t22, t23) and desired discharge voltages ($U_{wanted}$);

a first regression unit for determining and providing calculation data based on results of simulation of the first simulating unit;

a first measurement value unit for providing real-time measurement values of the resonant charging circuit;

a first evaluation unit for calculating the at least one user-predefined second switching time (t2) and a firing time (t3) based on the calculation data of the first regression unit and the real-time measurement values;

a control unit for triggering the discharging switch of the resonant charging circuit; and a mathematical modeling unit for determining a maximum achievable discharge voltage ($U_{max\ calculated}$) and a second switching time ($t21_{max\ calculated}$) based on at least one result of the first simulation unit given by one switching time (t21, t22, t23) and desired discharge voltages ($U_{wanted}$).

13. The device according to claim 12, further comprising:
the resonant charging circuit being an expanded resonant charging circuit having at least two resonant chargers, each of the at least two resonant chargers having its own voltage source having a supply voltage and a charging switch;

a first comparison unit for comparing supply voltages from the at least two resonant chargers;

a second comparison unit for comparing the supply voltages from the at least two resonant chargers; and a logic unit for simulating a second switching time ($t22_{simul}$) based on a symmetrical topology of the expanded resonant charging circuit generated by the logic unit.

14. The device according to claim 13, further comprising:
a second input unit;
a second simulation unit;
a second regression unit;
a second measurement value unit;
a second evaluation unit for determining a maximum achievable discharge voltage ($U_{max\ calculated}$) based on calculation data of the second regression unit and provided measurement values of the second measurement value unit, and
a third comparison unit for comparing the maximum achievable discharge voltage ($U_{max\ calculated}$) with a desired discharge voltage ($U_{wanted}$).

15. The device according claim 12, wherein the discharge switch can be triggered by the control unit at the firing time (t3).

16. The device according claim 13, wherein the discharge switch can be triggered by the control unit at the firing time (t3).

17. The device according claim 14, wherein the discharge switch can be triggered by the control unit at the firing time (t3).

* * * * *